United States Patent [19]

Ciari

[11] Patent Number: 5,419,351
[45] Date of Patent: May 30, 1995

[54] FINAL RINSE/DRY SYSTEM FOR CRITICAL CLEANING APPLICATIONS

[75] Inventor: Richard P. Ciari, San Jose, Calif.

[73] Assignee: National Semiconductor Corporation, Santa Clara, Calif.

[21] Appl. No.: 41,956

[22] Filed: Apr. 2, 1993

[51] Int. Cl.⁶ .............................................. B08B 3/04
[52] U.S. Cl. .................... 134/95.2; 134/96.1; 134/98.1; 134/99.1; 134/105; 134/113; 134/902
[58] Field of Search ...................... 134/902, 95.2, 96.1, 134/98.1, 99.1, 105, 113

[56] References Cited

U.S. PATENT DOCUMENTS

| | | | |
|---|---|---|---|
| 3,727,620 | 4/1973 | Orr ..................................... | 134/902 X |
| 4,749,440 | 6/1988 | Blackwood et al. ............ | 134/902 X |
| 4,917,123 | 4/1990 | McConnell et al. ............. | 134/902 X |
| 4,984,597 | 1/1991 | McConnell et al. ............. | 134/902 X |
| 5,039,349 | 8/1991 | Schoeppel ....................... | 134/98.1 X |
| 5,301,701 | 4/1994 | Nafziger .......................... | 134/902 X |

FOREIGN PATENT DOCUMENTS

| | | | |
|---|---|---|---|
| 80924 | 3/1992 | Japan ................................. | 134/902 |
| 139823 | 5/1992 | Japan ................................. | 134/902 |
| 151835 | 5/1992 | Japan ................................. | 134/902 |
| 3186 | 1/1993 | Japan ................................. | 134/902 |
| 144787 | 6/1993 | Japan ................................. | 134/902 |

OTHER PUBLICATIONS

The Effects of Iron Contamination on Thin Oxide Breakdown—Experimental and Modeling; W. B. Henley, L. Jastrzebski, and N. Haddad; Florida Institute of Technology; Jul., 1992.

Clean Water for Critical Processes; Ultrafiltration System; S&K Products International, Inc.

Fluoroware; Processing and Handling Products for the Semiconductor Industry; 1988-1989.

The Segregation and Removal of Metallic Impurities at the Interface of Silicon Wafer Surface and Liquid Chemicals Takashi Imaoka, Takehiko Kezuka, Jun Takano, Isamu Sugiyama, Tadahiro Ohmi; Jul. 1992.

*Primary Examiner*—Philip R. Coe
*Attorney, Agent, or Firm*—Bill D. McCarthy; Glen M. Burdick; Steve Robinson

[57] ABSTRACT

A final rinse/dry system for critical cleaning applications is provided having an ultrafiltration unit for providing an ultrapurified liquid to a holding chamber. A liquid conduit assembly connects the ultrafiltration unit to the holding chamber and controls the flow of the ultrapurified liquid therethrough. A liquid discharge assembly is connected to the liquid conduit assembly to selectively drain liquid from the holding chamber and the liquid conduit assembly. An inert gas conduit assembly provides the holding chamber with an inert atmosphere during drying, and a purge assembly is connected to the inert gas conduit assembly to bleed inert gas through the purge assembly to prevent contaminant build-up in the inert gas conduit assembly during the non-operating time thereof.

25 Claims, 1 Drawing Sheet

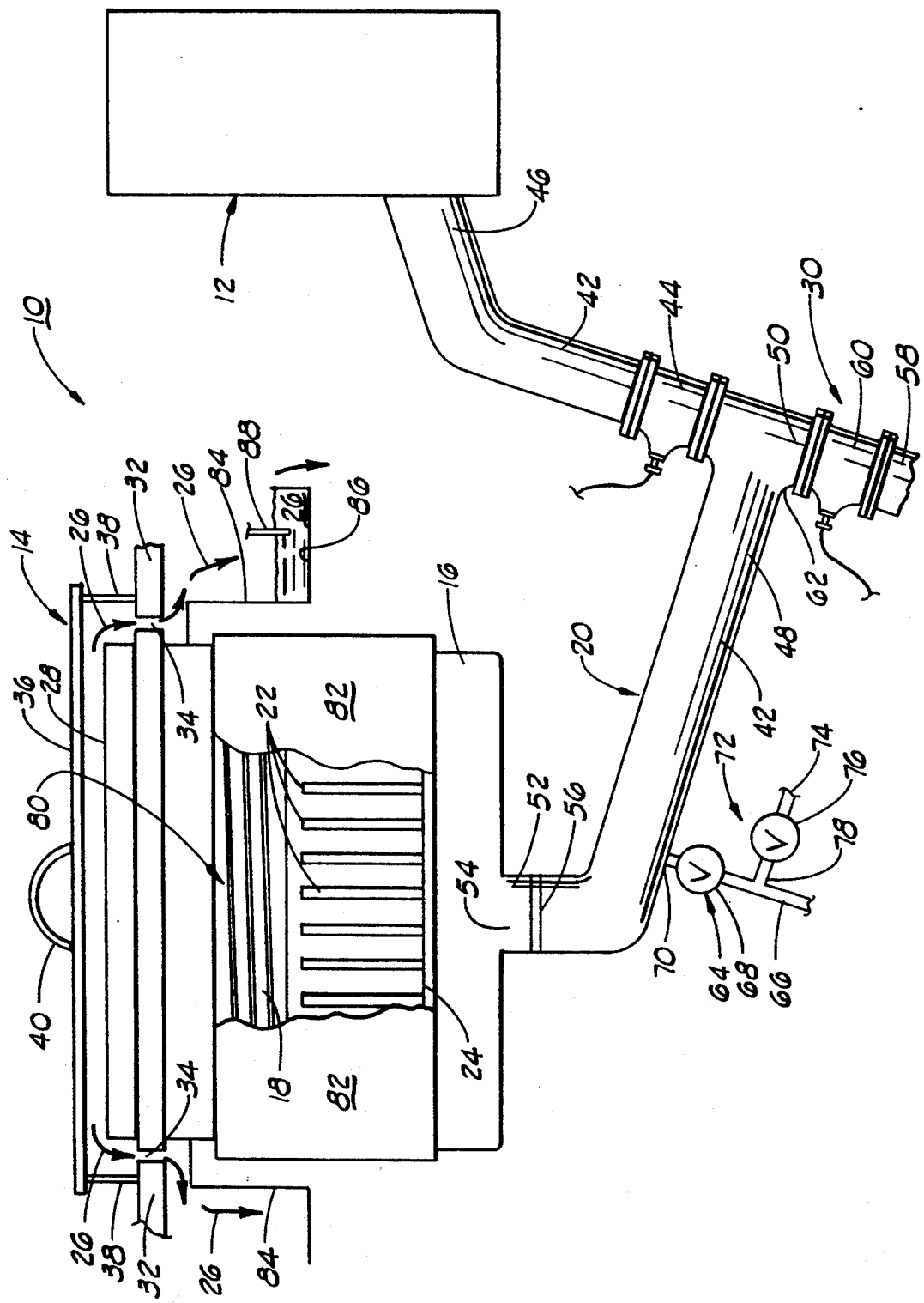

FINAL RINSE/DRY SYSTEM FOR CRITICAL CLEANING APPLICATIONS

BACKGROUND OF THE INVENTION

1. Field of the Invention

The present invention relates to final rinse/dry systems for critical cleaning applications, and more particularly but not by way of limitation, to a final rinse/dry system to provide silicon wafers with dry, ultraclean surfaces. In one aspect the present invention relates to a final rinse/dry module for use with an ultrafiltration system to provide silicon wafers with dry, ultraclean surfaces substantially free of contaminants and surface microroughness.

2. Brief Description of the Prior Art

Systems have heretofore been proposed for preparing silicon wafers for oxidation and other treatments so that films having desired electronic properties can be formed on the surfaces of the wafers. However, such prior art systems have generally suffered from inherent defects which result in contamination of the surfaces of the wafers or uncontrolled chemical reactions which occur due to interaction of the prepared silicon wafer surface with the environment to which the silicon wafer is subjected. That is, the character of the surfaces of the silicon wafers often varies depending upon the position of the wafers in the system; and spray post dispensing of deionized water onto the wafers often causes a chemical reaction on hydrophobic silicon surfaces.

In the preparation of silicon wafers having ultraclean surfaces it is important that the surfaces of the wafers be free of native oxide and metallic impurities. Certain prior art systems employ a spinning rotor to enhance contact of the cleaning/rinsing solutions with the wafers during preparation of the wafers. However, spinning of a rotor on a metal bearing surface often results in metal contamination of the silicon wafer.

Native oxide and metallic impurities cannot be suppressed from the surfaces of silicon wafers if poorly optimized conditions are present on the wafer surfaces. Thus, in the final preparation of silicon wafers prior to critical processes, it is essential that the surfaces of the silicon wafers also be free of defect-generating mechanisms.

While advances have been made in systems for preparing silicon wafers, such advancements have generally been directed to reducing the cycle time for cleaning, drying and preparing the wafers, while sacrificing yield of the wafers due to contamination. Therefore, a need remains for an improved system for preparing silicon wafers which is cost effective, which permits the wafers to be rinsed and dried without exposure to widely varying dynamic conditions and sources of metallic contaminates or uncontrolled chemical reactions, and which overcomes the defects of the prior art systems. It is to such a system and rinse/dry module for the system that the present invention is directed.

SUMMARY OF THE INVENTION

The present invention is directed to a final rinse/dry system for critical cleaning applications, such as the cleaning of silicon wafers. Broadly, the final rinse/dry system includes an ultrafiltration unit operably connected to a rinse/dry module so that an ultrapurified liquid produced by the ultrafiltration unit, such as ultrapurified deionized water, can be passed through the rinse/dry module to rinse articles supported within a holding chamber of the rinse/dry module.

The rinse/dry module includes a housing containing the holding chamber. A liquid conduit assembly, which connects the ultrafiltration unit to the housing so that fluid communication is provided therebetween, selectively controls the flow of the ultrapurified liquid from the ultrafiltration unit to the holding chamber of the housing. A liquid discharge assembly is connected to the liquid conduit assembly so that when the liquid conduit assembly is in a non-operative state, that is, the flow of the ultrapurified liquid from the ultrafiltration unit to the holding chamber is ceased, liquid present in the holding chamber can be drained therefrom via the liquid discharge assembly prior to drying the articles supported within the holding chamber.

The rinse/dry module further includes an inert gas conduit assembly for providing the holding chamber with an inert atmosphere during the drying of the rinsed articles, and a heat source for heating the holding chamber during the drying of the rinsed articles supported therein. A purge assembly is connected to the inert gas conduit assembly so that when the inert gas conduit assembly is in a non-operative state, i.e. when the flow of the inert gas into the holding chamber is ceased, inert gas is bled through the purge assembly to prevent contaminate build-up in the inert gas conduit assembly.

An object of the present invention is to provide an improved final rinse/dry system for critical cleaning applications.

Another object of the present invention, while achieving the before-stated object, is to provide an improved final rinse/dry system capable of providing silicon wafers with dry, ultraclean surfaces substantially free of contaminants and microroughness.

Another object of the present invention, while achieving the before-stated objects, is to provide an improved final rinse/dry system adapted for use with conventional wet bench designs.

Another object of the present invention, while achieving the before-stated objects, is to provide an improved rinse/dry module for use with a conventional ultrafiltration unit which is economical to manufacture, which is compatible with existing wet bench designs, and which overcomes the deficiencies of prior art modules.

Other objects, advantages and features of the present invention will become apparent upon reading of the following detailed description in conjunction with the appended claims.

BRIEF DESCRIPTION OF THE DRAWING

The drawing is a partially detailed, schematic representation of a rinse/dry system for critical cleaning applications constructed in accordance with the present invention.

DETAILED DESCRIPTION

Referring now to the drawing, a final rinse/dry system 10 of the present invention for use in critical cleaning applications, such as the rinsing and drying of silicon wafers, is schematically illustrated. The final rinse/dry system 10 (which is installed in a conventional wet bench, not shown) is provided with an ultrafiltration unit 12 and a rinse/dry module 14. The ultrafiltration unit 12 is connected to a source of deionized water (not shown) in a conventional manner. The ultrafiltration unit 12 is designed to remove contaminants, such as particles, bacteria, colloidal materials and organic carbons, from deionized water so as to provide a supply of ultrapurified deionized water for the rinse/dry module 14; and the rinse/dry module 14 is designed to clean and dry the surfaces of articles which must be free of contaminants such as particles, organic materials, metallic impurities, native oxide, surface microroughness and adsorbed molecular impurities.

Any submicroscopic filtration unit capable of removing contaminants from deionized water, such as suspended organisms and particles down to about 0.003 microns, can be employed as the ultrafiltration unit 12 of the final rinse/dry system 10 of the present invention. For example, desirable results can be achieved when the ultrafiltration unit 12 of the final rinse/dry system 10 is an S&K Ultrafiltration System manufactured by S&K Products International, Inc. of Spring valley, N.Y. Since submicroscopic filtration units which can be employed as the ultrafiltration unit 12 in the final rinse/dry system 10 are well known and commercially available, no further comments concerning the description or function of such filtration units are believed necessary to enable one skilled in the art of critical cleaning applications to fully understand and practice the invention disclosed herein.

The rinse/dry module 14 includes a housing 16 having a holding chamber 18 formed therein and a liquid inlet conduit assembly 20 for connecting the housing 16 to the ultrafiltration unit 12 so that fluid communication is provided between the holding chamber 18 of the housing 16 and the ultrafiltration unit 12. As will be described in more detail hereinafter, the liquid inlet conduit assembly 20 has an operative mode and a non-operative mode for selectively controlling the flow of ultrapurified deionized water to the housing 16.

In its operative mode the liquid inlet conduit assembly 20 passes ultrapurified deionized water from the ultrapurification unit 12 to the housing 16. The ultrapurified deionized water flows through holding chamber 18 of the housing 16 wherein it contacts and rinses articles supported in the holding chamber 18, such as silicon wafers 22 supported in a tray or carrier 24. The ultrapurified deionized water then exits the holding chamber 18 as a spent effluent stream 26 via an open upper end 28 of the housing 16.

In its non-operative mode the liquid inlet conduit assembly 20 interrupts the flow of the ultrapurified deionized water from the ultrapurification unit 12 to the housing 16. Thus residual deionized water present in the holding chamber 18 can be drained from the holding chamber 18 by activation of a liquid discharge assembly 30.

The housing 16 is provided with a surface mount or bracket 32 for securing the housing 16 in a stable position in a wet bench (not shown). The surface mount 32 extends around the perimeter of the housing 16 and is provided with a plurality of openings 34 through which the effluent stream 26 from the holding chamber 18 of the housing 16 is directed. The housing 16 is also provided with a cover or lid 36 having a plurality of spatially disposed stand off or pedestal members 38 and a handle member 40. The stand off members 38 are disposed about the perimeter of the cover 36, such as at the corners thereof. Thus, in an assembled position, the cover 36 is spatially disposed above the open upper end 28 of the housing 16 substantially as shown; and the open upper end 28 of the housing 16 and the cover 36 cooperate to define a flow path for the effluent stream 26 of spent deionized water exiting the holding chamber 18 of the housing 16 when the liquid inlet conduit assembly 20 is in its operative mode.

In addition to cooperating with the housing 16 to define the flow path for the spent effluent stream 26, the cover 36 also functions in a conventional manner to protect the holding chamber 18 of the housing 16 from external sources of particulate and chemical contamination. Further, the cover 36, provides an increased residence time of the inert gas in the holding chamber 18 when the holding chamber 18 is purged with an inert gas during the drying of articles therein, and utilizes the principle of "Henry's Law" of chemistry to aid the drying action on the silicon wafers 22.

The housing 16 and the cover 36 are fabricated of a non-metallic material so that the articles rinsed and dried in the holding chamber 18 are not exposed to metal. Similarly, the tray 24 employed to hold the silicon wafers 22 in the holding chamber 18 is fabricated of a non-metallic material, while any suitable non-metallic material which does not degrade to produce impurities can be employed in the fabrication of the housing 16, the tray 24 and the cover 36, desirable results will be obtained when the housing 16 is fabricated of quartz, and the tray 24 and cover 36 are fabricated of non-degradable polymeric material. A commercially available wafer carrier which can be employed as the tray 24 to support the silicon wafers 22 in the holding chamber 18 is a model A182-60MB-0215 wafer carrier marketed by Fluoroware, Inc. Polycarbonate covers which can be used as the cover 36 are also commercially available.

The liquid inlet conduit assembly 20 (which provides fluid communication between the ultrafiltration unit 12 and the holding chamber 18 of the housing 16, while also controlling the flow of ultrapurified deionized water from the ultrafiltration unit 12 to the holding chamber 18 during the rinse phase of the final rinse/dry system 10) includes a fluid flow conduit 42 and a normally closed control valve 44. The fluid flow conduit 42 is characterized as having: an upstream end portion 46; a medial portion 48 having a discharge port 50; and a downstream end portion 52. The upstream end portion 46 of the fluid flow conduit 42 is connected to the ultrafiltration unit 12 and the downstream end portion 52 of the fluid flow conduit 42 is connected to the housing 16 so that fluid communication is established between the ultrafiltration unit 12 and the holding chamber 18 of the housing 16 via the fluid flow conduit 42 and an inlet port 54 of the housing 16. A diffuser grate 56 is provided in the downstream end portion 52 of the fluid flow conduit 42 for diffusing the ultrapurified deionized water and an inert gas stream, prior to introduction of the ultrapurified deionized water and the inert gas stream into the holding chamber 18 of the housing 16.

The fluid flow conduit 42 is configured so that in a connected position its medial portion 48 is disposed below the upstream and downstream end portions 46, 52, respectively; and the discharge port 50 of the medial portion 48 is disposed at the lowermost position of the medial portion 48, substantially as shown.

The control valve 44 of the liquid inlet conduit assembly 20 is preferably an electro-pneumatic valve which is operatively connected to a controller (not shown) in a conventional manner. The control valve 44 is disposed within the fluid flow conduit 42 upstream of the liquid discharge assembly 30. Thus, when the liquid discharge assembly 30 is closed (its non-operative state) and the ultrafiltration unit 12 is in an operative state, the controller provides a signal to open the normally closed control valve 44 to pass the ultrapurified deionized water from the ultrafiltration unit 12 to the holding chamber 18 of the housing 16 via the fluid flow conduit 42. The controller (not shown) is a conventional control mechanism well known and understood in the prior art and need not be described herein.

After the articles supported within the holding chamber 18 of the housing 16, such as the silicon wafers 22, have been sufficiently rinsed to remove substantially all impurities or contaminants from the surfaces thereof, the ultrafiltration unit 12 is placed in its non-operative state and the controller provides a signal to close the control valve 44. Thereafter, residual deionized water present in the holding chamber 18 of the housing 16 can be removed by activating the liquid discharge assembly 30.

The liquid discharge assembly 30 is connected to the medial portion 48 of the fluid flow conduit 42 such that fluid communication can be selectively established with the holding chamber 18 of the housing 16 for gravitationally draining deionized water from the holding chamber 18. That is, when flow of ultrapurified deionized water to the holding chamber 18 through the fluid flow conduit 42 is interrupted or ceased by closing the control valve 44 and placing the ultrafiltration unit 12 in a non-operative state, residual deionized water present in the holding chamber 18 of the housing 16 can be drained therefrom by activation of the liquid discharge assembly 30. It should be noted that gravitational draining of the residual deionized water from the holding chamber 18 by activation of the liquid discharge assembly 30 provides a capillary effect which enhances removal of residual surface water from the objects in the holding chamber 18, such as the silicon wafers 22.

The liquid discharge assembly 30 includes a discharge conduit 58 and a normally closed control valve 60. The control valve 60 is preferably an electro-pneumatic valve and is controlled by the controller (not shown) mentioned hereinabove and which controls the control valve 44. One end 62 of the discharge conduit 58 is connected to the medial portion 48 of the fluid flow conduit 42 so that fluid communication is established therebetween via the discharge port 50 of the fluid flow conduit 42. The normally closed control valve 60 is disposed within the discharge conduit 58 and controls the flow of fluid through the discharge conduit 58. Thus, when the liquid inlet conduit assembly 20 and the ultrafiltration unit 12 are in a non-operative state, residual deionized water present in the holding chamber 18 of the housing 16 can be drained therefrom by opening the normally closed control valve 60 in response to a signal provided by the controller (not shown).

Any suitable normally closed control valve can be used as the control valve 44 of the liquid inlet conduit assembly 20. The control valve 60 of the liquid discharge assembly 30 is intended to have a variable outlet bleed to optimize capillary action. Since normally closed control valves are well known and commercially available items, no further description of such valves or their operation is believed necessary to enable one skilled in the art to understand and practice the final rinse/dry system 10 of the present invention.

After the residual deionized water has been removed from the holding chamber 18 of the housing 16 via activation of the liquid discharge assembly 30, an inert gas is introduced into the holding chamber 18 so as to provide the holding chamber 18 with an inert atmosphere. By providing the holding chamber 18 of the housing 16 with an inert atmosphere, formation of native oxide on the surfaces of the critically cleaned articles, such as the silicon wafers 22, is substantially eliminated when articles are dried in the final rinse/dry system 10.

In order to provide the holding chamber 18 of the housing 16 with an inert atmosphere, an inert gas inlet assembly 64 is connected to the fluid flow conduit 42 of the liquid inlet conduit assembly 20 so that fluid communication is established between the holding chamber 18 of the housing 16 and the inert gas inlet assembly 64. The inert gas inlet assembly 64 includes a gas conduit 66 and a normally closed gas control valve 68. One end 70 of the gas conduit 66 is connected to the fluid flow conduit 42 of the liquid inlet conduit assembly 20 so as to be disposed upstream to the diffuser grate 56 and downstream from the discharge conduit 58 Of the liquid discharge assembly 30; a second end (not shown) of the gas conduit 66 is connected to a source of ultrapurified inert gas. The gas control valve 68 is disposed in the gas conduit 66 in close proximity to the end 70 thereof and selectively controls the flow of inert gas into the holding chamber 18 of the housing 16 via the gas conduit 66. Thus, when the gas control valve 68 is moved to its open position, fluid communication is established between the source of the inert gas and the holding chamber 18 of the housing 16 via the gas conduit 66 and the fluid flow conduit 42 substantially as shown.

The gas control valve 68 is maintained in the closed position when ultrapurified deionized water is introduced into the holding chamber 18 of the housing 16 via the liquid inlet conduit assembly 20, as well as when the residual deionized water is gravitationally drained from the holding chamber 18 of the housing 16 via the liquid discharge assembly 30. Thus, particulate matter and other impurities present in the inert gas tend to build-up or concentrate in the gas conduit 66 at a position adjacent an inlet (not shown) of the gas control valve 68. Such a build-up of particulate matter or impurities is detrimental because of the tendency of such particulate matter to clog the gas conduit 66 and/or the gas control valve 68, thereby preventing the efficient operation of the inert gas inlet assembly 64 of the final rinse/dry system 10. In addition, introduction of such a concentration of particulate matter or impurities into the holding chamber 18 of the housing 16 may result in contamination of the articles being dried in the holding chamber 18, such as contamination of the surfaces of the silicon wafers 22.

To prevent the build-up of particulate matter and impurities in the gas conduit 66 of the inert gas inlet assembly 64, the final rinse/dry system 10 is also provided with a purging assembly 72. The purging assembly 72 is connected to the gas conduit 66 of the inert gas inlet assembly 64 so that the gas conduit 66 can be purged with inert gas when the gas control valve 68 is in the closed position during non-operative times of the inert gas inlet assembly 64.

The purging assembly 72 includes a purge conduit 74 and a normally open gas control valve 76. One end 78 of the purge conduit 74 is connected to the gas conduit 66 upstream of the gas control valve 68 of the inert gas inlet assembly 64 so that fluid communication is provided therebetween. The normally open gas control valve 76 of the purging assembly 72 is disposed within the purge conduit 74 so that inert gas flows through the portion of the gas conduit 66 upstream of the gas control valve 68 and the purge conduit 74 when the gas control valve 76 of the purging assembly 72 is in the open position and the gas control valve 68 of the inert gas inlet assembly 64 is in the closed position. Thus, a constant bleed of inert gas is provided through the gas conduit 66 of the inert gas inlet assembly 64 which reduces particulate build-up in the gas conduit 66 when the gas control valve 68 is closed during non-operative times of the inert gas inlet assembly 64.

To enhance drying of articles in the holding chamber 18 of the housing 16, the final rinse/dry system 10 is also provided with a heating source, such as housing heater 80. The temperature at which the holding chamber 18 of the housing 16 is maintained during the drying of the articles supported therein can vary widely, but will generally depend on the nature of the articles being dried and the characteristics of the heating source. However, when drying silicon wafers 22, the holding chamber 18 is desirably maintained at a temperature within the range of from about 30 to about 50 degrees Centigrade.

The heating source, such as housing heater 80, can also be maintained in the operative state while articles are rinsed in the holding chamber 18 of the housing 16 by the passage of the ultrapurified deionized water through the holding chamber 18. However, because of the constant flow of the ultrapurified deionized water through the holding chamber 18 of the housing 16 during the rinsing of the articles, heat generated by the heating source is rapidly dissipated. Thus, no known degradation occurs by maintaining heat on the holding chamber 18 of the housing 16 when the articles are being rinsed by the passage of the ultrapurified deionized water through the holding chamber 18.

While the housing heater 80 has been illustrated as the heating source for the final rinse/dry system 10, it should be understood that the present invention is not limited to any particular device as the heating source. Thus, other well known heating sources, such as heating tapes and the like, can be employed to maintain the holding chamber 18 of the housing 16 as well as the liquid inlet conduit assembly 20, within the desired temperature range during the drying of articles supported therein without departing from the inventive concept disclosed herein.

In order to insure that the holding chamber 18 of the housing 16 is maintained within the desired temperature range during the drying of the articles therein, the final rinse/dry system 10 may further include a blanket of insulation 82 and a heater shield assembly 84. The blanket of insulation 82 is disposed about the housing 16 so as to thermally insulate the holding chamber 18; and the heater shield assembly 84 extends outwardly from the housing 16 so as to be disposed about a portion of the blanket of insulation 82 substantially as shown.

It may be desirable to measure certain properties of the spent deionized water (i.e. the effluent stream 26 discharged from the holding chamber 18 of the housing 16 via the flow path formed between the open upper end 28 of the housing 16 and the cover 36) to determine when the articles rinsed with the ultrapurified deionized water in the holding chamber 18 of the housing 16 possess ultraclean surfaces substantially free of contaminants. For example, the resistivity of the effluent stream 26 can be measured using a conventional resistivity probe, and such resistivity measurements can then be compared with the baseline resistivity of the ultrapurified deionized water produced by the ultrafiltration unit 12. When the measured resistivity of the effluent stream 26 substantially corresponds with the baseline resistivity of the ultrapurified deionized water the rinsing of the articles is completed and the articles possess ultraclean surfaces substantially free from contaminants.

In order to measure selected properties of the effluent stream 26 discharged from the holding chamber 18 of the housing 16, the heater shield assembly 84 is provided with a trap 86 for collecting a portion of the effluent stream 26 and a resistivity probe 88. The volume of the trap 86 should be large enough to insure that a sufficient volume of the effluent stream 26 is trapped at any one time to permit measurements to be made by the resistivity probe 88 on the effluent stream 26 in the trap 86.

To enhance ones understanding of the final rinse/dry system 10, including the rinse/dry module 14 and its relationship to the ultrafiltration unit 12, a brief description of the operation of the final rinse/dry system 10 will now be set forth with reference to the drawing. As previously indicated, the final rinse dry system 10 can be supported in a conventional wet bench. Thus, the spent effluent stream 26 from the holding chamber 18 of the housing 16 can be discharged into a drain in a conventional manner.

In the operation of the final rinse/dry system 10 the ultrafiltration unit 12 is connected to the source of deionized water and the ultrafiltration unit 12 is connected to the rinse/dry module 14 so that fluid communication is provided therebetween. The various valves are checked to determine if the valves are disposed in their desired operating modes.

The normally closed control valve 44 of the liquid inlet conduit assembly 20 is operably connected to the controller (not shown) so that the control valve 44 is operated in response to signals provided by the controller. Similarly, the normally closed control valve 60 of the liquid discharge assembly 30 is operably connected to the controller so that the control valve 60 is operated in response to signals provided by the controller.

The gas conduit 66 is connected to a source of an inert gas suitable for providing the holding chamber 18 of the housing 16 with an inert atmosphere during the drying of the silicon wafers 22. The normally closed gas control valve 68 of the inert gas inlet assembly 64 is maintained in its closed position and the normally open gas control valve 76 of the purging assembly 72 is maintained in its open position so that the inert gas can bleed through the gas control valve 76 and the purge conduit 74 of the purging assembly 72 to prevent particulate and contaminant build-up in the gas conduit 66 when the inert gas is not being directed into the holding chamber 18 of the housing 16.

Once the final rinse/dry system 10 has been properly setup, the control valve 44 is opened so that the ultrapurified deionized water flows through the fluid flow conduit 42 and into the holding chamber 18 of the housing 16. The tray 24 containing the articles to be cleaned, such as the silicon wafers 22, is then placed into the holding chamber 18 of the housing 16; and the cover 36 is positioned above the open upper end 28 of the housing 16 so that the flow path for the spent effluent stream 26 exiting the holding chamber 18 is provided between the open upper end 28 of the housing 16 and the cover 36.

Passage of the ultrapurified deionized water through the holding chamber 18 is maintained for a period of time effective to insure that the surfaces of the silicon wafers 22 are in an ultra-clean condition or until the properties of the spent effluent stream 26 correspond with similar baseline properties of the ultrapurified deionized water as measured by a suitable probe, such as the resistivity probe 88.

Once it is determined that the surfaces of the silicon wafers 22 are in an ultra-clean condition, the flow of the ultrapurified deionized water through the holding chamber 18 is interrupted by closing the control valve 44 of the liquid inlet conduit assembly 20. The control valve 60 of the liquid discharge assembly 30 is then opened so the that the residual deionized water present in the holding chamber 18 of the housing 16 can be gravitationally drained therefrom via the discharge conduit 58 of the liquid discharge assembly 30. The drainage of the residual deionized water from the holding chamber 18 is desirably controlled so that the a capillary effect is provided which enhances removal of residual surface water from the silicon wafers 22. When the drainage of the deionized water from the holding chamber 18 of the housing 16 is completed, the gas control valve 76 of the purging assembly 72 is closed and the gas control valve 68 of the inert gas inlet assembly 64 is opened. Thus, a stream of inert gas, such as argon or nitrogen, is introduced into the housing 16 so that the holding chamber 18 of the housing 16 is provided with an inert atmosphere which enhances removal of residual surface water from the silicon wafers 22, while at the same time substantially reducing the possibility of contamination of the silicon wafers 22 during the drying of same in the holding chamber 18. If desired, the holding chamber 18 can be heated to a temperature of from about 25 to about 50 degrees Centigrade by activation of a heat source, such as the housing heater 80, to enhance the drying of the silicon wafers 22. After drying of the silicon wafers 22 is completed, the gas control valve 68 of the inert gas inlet assembly 64 is closed and the gas control valve 76 of the purging assembly 2 is opened. Thereafter, the tray 24 and the silicon wafers 22 are removed from the holding chamber 18 of the housing 16. The silicon wafers 22 processed in the final rinse/dry system 10 of the present invention possess ultra-clean surfaces because the silicon wafers 22 are not exposed to any metal parts during the rinsing or drying of same. In addition the rinsing of the silicon wafers 22 is provided by the flow of ultrapurified deionized water, whereas the drying of the silicon wafers 22 is achieved by the flow of an ultrahigh purity inert gas, such as argon or nitrogen, and when desired, gentle heat. Thus, surfaces of the silicon wafers 22 processed in the final rinse/dry system 10 are substantially free from conventional rinse/dry system generated sources of particles, organic materials, metallic impurities, native oxide, and adsorbed molecular impurities, as well as surface microroughness.

It is clear that the present invention is well adapted to carry out the objects and attain the ends and advantages mentioned herein. While presently preferred embodiments of the invention have been described for purposes of this disclosure, numerous changes may be made which will readily suggest themselves to those skilled in the art and which are encompassed within the spirit of the invention disclosed and as defined in the appended claims.

What is claimed is:

1. A final rinse/dry system for critically cleaning articles comprising:

prefiltration means for removing contaminants from a liquid to provide an ultrapurified liquid;

housing means having a holding chamber formed therein for supporting articles to be rinsed and dried, the housing means further having an open upper end openly communicating with the holding chamber;

liquid inlet conduit means for selectively flowing the ultrapurified liquid to the holding chamber so that the ultrapurified liquid rinses the articles supported in the holding chamber prior to exiting the holding chamber via the open upper end of the housing means as a spent effluent stream;

liquid discharge means for selectively draining residual liquid from the holding chamber when the prefiltration means is in a non-operative state in which the flow of the ultrapurified liquid to the holding chamber is ceased;

inert gas conduit means for selectively flowing an inert gas to the housing so as to provide the holding chamber of the housing with an inert atmosphere following drainage of the residual liquid therefrom;

purging means for purging the inert gas conduit means during non-operative times thereof; and heating means for heating the holding chamber to dry the article supported therein in the inert atmosphere in the holding chamber.

2. The final rinse/dry system of claim 1 further comprising:

cover means cooperating with the open upper end of the housing means for providing a fluid flow path for the spent effluent stream.

3. The final rinse/dry system of claim 1 further comprising:

diffuser means for diffusing the ultrapurified liquid and the inert gas prior to flowing of the ultrapurified liquid and the inert gas to the holding chamber.

4. The final rinse/dry system of claim 1 further comprising:

means for measuring the resistivity of the spent effluent stream.

5. The final rinse/dry system of claim 4 further comprising:

tray means disposed within the holding chamber of the housing means for supporting a plurality of articles therein.

6. The final rinse/dry system of claim 5 further comprising:

insulation means disposed about the housing means for thermally insulating the holding chamber.

7. The final rinse/dry system of claim 6 further comprising:

shield means for shielding the heating means.

8. The final rinse/dry system of claim 1 wherein the liquid inlet conduit means comprises:

a fluid flow conduit having an upstream end portion, a medial portion and a downstream end portion, the upstream end portion thereof connected to the prefiltration means and the downstream end portion thereof connected to the housing means so that fluid communication is provided between the prefiltration means and the holding chamber of the housing means, the medial portion of the fluid flow conduit connected to the liquid discharge means such that the liquid discharge means is disposed below the upstream and downstream end portions of the fluid flow conduit; and a normally closed valve disposed within the fluid flow conduit so as to be disposed upstream of the liquid discharge means, the normally closed valve selectively controlling the flow of the ultrapurified liquid to the holding chamber of the housing means.

9. The final rinse/dry system of claim 8 wherein the liquid discharge means comprises:
a discharge conduit connected to the medial portion of the fluid flow conduit so that fluid communication is established therebetween; and
a normally closed valve disposed within the discharge conduit, the normally closed valve selectively controlling the flow of the ultrapurified liquid from the holding chamber of the housing means via the discharge conduit.

10. The final rinse/dry system of claim 9 wherein the inert gas inlet means comprises:
a gas conduit connected to the fluid flow conduit downstream of the discharged conduit so that fluid communication is established between the fluid flow conduit and the gas conduit; and
a normally closed gas control valve disposed within the gas conduit for selectively controlling the flow of the inert gas through the holding chamber of the housing means.

11. The final rinse/dry system of claim 10 wherein the purging means comprises:
a purge conduit connected to the gas conduit upstream of the normally closed gas control valve so that the purge conduit and the gas conduit are in fluid communication; and
a normally open gas control valve disposed within the purge conduit for providing inert gas flow through the purge conduit when the normally closed gas control valve is in the closed position.

12. The final rinse/dry system of claim 11 further comprising:
trap means for collecting a portion of the spent effluent stream; and
means for measuring the resistivity of the spent effluent stream.

13. A final rinse/dry module for rinsing and drying articles, wherein the module is connectable to a source of ultrapurified deionized water which is substantially free of particles, bacteria, colloidal silica and organic carbons, the module comprising:
housing means having an open upper end and a holding chamber for supporting the articles, the holding chamber openly communicating with the open upper end of the housing means;
liquid inlet conduit means connected to the housing means for selectively flowing the ultrapurified deionized water to the holding chamber for rinsing contact with the articles supported therein prior to exiting the holding chamber via the open upper end of the housing means as a spent effluent stream;
liquid discharge means for selectively removing residual deionized water from the holding chamber of the housing means when the liquid inlet conduit means is in a non-operative state in which flow of the ultrapurified deionized water to the liquid inlet conduit means is interrupted;
inert gas conduit means for selectively flowing an inert gas to the holding chamber following removal of the residual deionized water therefrom so as to provide the holding chamber with an inert atmosphere;
purging means for purging the inert gas conduit means during non-operating times thereof in which the flow of the inert gas to the holding chamber is interrupted; and
heating means for heating the holding chamber of the housing means to temperature of from about 30 to about 50 degrees Centigrade so as to enhance drying of the articles in the presence of the inert atmosphere in the holding chamber.

14. The final rinse/dry module of claim 13 further comprising:
cover means cooperating with the housing means for providing a flow path for the spent effluent stream and for preventing particulate contamination of the holding chamber.

15. The final rinse/dry module of claim 14 further comprising;
means for diffusing the ultrapurified deionized water and the inert gas prior to passage of same to the holding chamber of the housing means.

16. The final rinse/dry module of claim 15 further comprising:
trap means disposed within the flow path of the spent effluent stream for collecting a portion of the spent effluent stream; and
means for measuring the resistivity of the spent effluent stream collected in the trap means.

17. The final rinse/dry module of claim 13 further comprising:
means for measuring the resistivity of the spent effluent stream.

18. The final rinse/dry module of claim 13 further comprising:
tray means disposed within the holding chamber of the housing means for supporting the articles in the holding chamber.

19. The final rinse/dry module of claim 18 further comprising:
insulation means disposed about the housing means for thermally insulating the holding chamber of the housing means.

20. The final rinse/dry module of claim 19 further comprising:
shield means for shielding the heating means.

21. The final rinse/dry system of claim 13 wherein the liquid inlet conduit means comprises:
a fluid flow conduit having an upstream end portion, a medial portion and a downstream end portion, the upstream end portion connectable to the source of ultrapurified deionized water and the downstream end portion connectable to the housing means so that a fluid-tight seal is formed therebetween and fluid communication is provided between the source of the ultrapurified deionized water and the holding chamber of the housing means, the medial portion of the fluid flow conduit connectable to the liquid discharge means such that the liquid discharge means is disposed below the upstream and downstream end portions of the fluid flow conduit; and
a normally closed valve disposed within the fluid flow conduit upstream of the liquid discharge means, the normally closed valve selectively controlling the flow of the ultrapurified water to the holding chamber of the housing means.

22. The final rinse/dry module of claim 21 wherein the liquid discharge means comprises:

a discharge conduit connected to the medial portion of the fluid flow conduit so that fluid communication is established therebetween; and a normally closed valve disposed within the discharge conduit for controlling the flow of residual deionized water from the holding chamber of the housing means through the discharge conduit.

23. The final rinse/dry module of claim 22 wherein the inert gas inlet means comprises:

a gas conduit connected to the fluid flow conduit downstream of the discharge conduit so that fluid communication is established between the fluid flow conduit and the gas conduit; and a normally closed gas control valve disposed within the gas conduit for controlling the flow of the inert gas through the holding chamber of the housing means.

24. The final rinse/dry module of claim 23 wherein the purging means comprises:

a purge conduit connected to the gas conduit upstream of the normally closed gas control valve so that the purge conduit and the gas conduit are in fluid communication; and a normally open gas control valve disposed within the purge conduit for permitting gas to flow through the purge conduit when the normally closed gas control valve is in the closed position.

25. The final rinse/dry module of claim 24 wherein the housing means is fabricated of quartz, and the cover means is fabricated of a polycarbonate material.

* * * * *

UNITED STATES PATENT AND TRADEMARK OFFICE
CERTIFICATE OF CORRECTION

PATENT NO.   :   5,419,351
DATED        :   May 30, 1995
INVENTOR(S)  :   Richard P. Ciari It is certified that error appears in the above-indentified patent and that said Letters Patent is hereby corrected as shown below:

Column 9, line 40, delete "2" and substitute therefor --72--.

Signed and Sealed this

Fourteenth Day of November, 1995

Attest:

BRUCE LEHMAN

*Attesting Officer*     *Commissioner of Patents and Trademarks*